United States Patent [19]

Cok et al.

[11] Patent Number: 4,884,035

[45] Date of Patent: * Nov. 28, 1989

[54] WIDE RANGE DIGITAL PHASE/FREQUENCY DETECTOR

[75] Inventors: Steven P. Cok; Robert J. Lewandowski, both of Seattle, Wash.

[73] Assignee: John Fluke Mfg. Co. Inc., Everett, Wash.

[*] Notice: The portion of the term of this patent subsequent to Jun. 27, 2006 has been disclaimed.

[21] Appl. No.: 351,229

[22] Filed: May 15, 1989

Related U.S. Application Data

[63] Continuation of Ser. No. 105,468, Aug. 17, 1987, Pat. No. 4,843,332.

[51] Int. Cl.⁴ .......................... H03K 9/06; H03D 13/00
[52] U.S. Cl. ..................................... 328/133; 328/110; 328/162; 307/511
[58] Field of Search ............... 328/133, 134, 155, 162, 328/109, 110; 307/511, 491, 262

[56] References Cited

U.S. PATENT DOCUMENTS

| | | | |
|---|---|---|---|
| 4,264,866 | 4/1981 | Benes | 328/134 |
| 4,267,514 | 1/1979 | Kimsey | 328/133 |
| 4,277,754 | 10/1979 | Minakuchi | 328/133 |
| 4,333,055 | 11/1979 | Crackel | 328/133 |
| 4,599,570 | 7/1982 | Cloke | 328/155 |

FOREIGN PATENT DOCUMENTS

| | | |
|---|---|---|
| 3115057 | 4/1981 | Fed. Rep. of Germany . |
| 2161660 | 7/1984 | United Kingdom . |

*Primary Examiner*—Stanley D. Miller
*Assistant Examiner*—Timothy P. Callahan
*Attorney, Agent, or Firm*—Stephen A. Becker; Mikio Ishimaru

[57] ABSTRACT

A digital phase/frequency detector circuit in a phase locked loop comprises a logic gate interconnected with a pair of bistable devices clocked respectively by input and reference digital signals to generate a square wave having a duty ratio corresponding to the phase/frequency difference between the two signals. The duty ratio of the square wave sweeps repetitively between minimum and maximum values as the phase/frequency difference changes monotonically. The square wave is integrated to obtain a repetitive sawtooth. To increase the range, circuitry is provided to provide a constant level signal when the peak of a sawtooth is approached and to reset the bistable devices to provide a multiple of the earlier range.

4 Claims, 4 Drawing Sheets

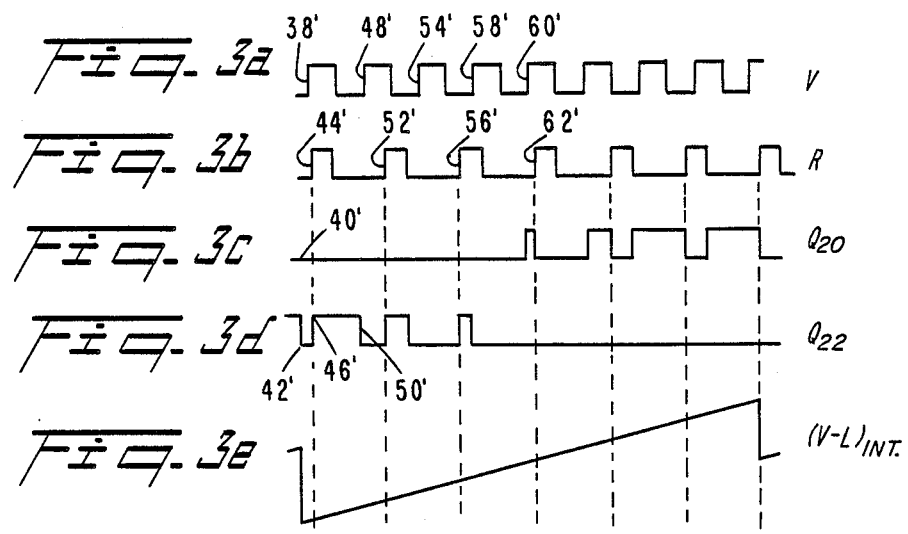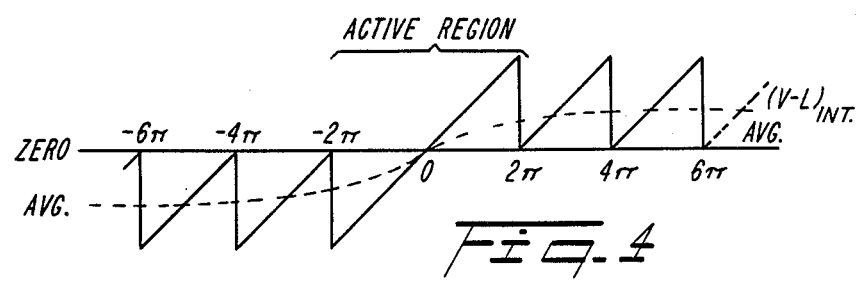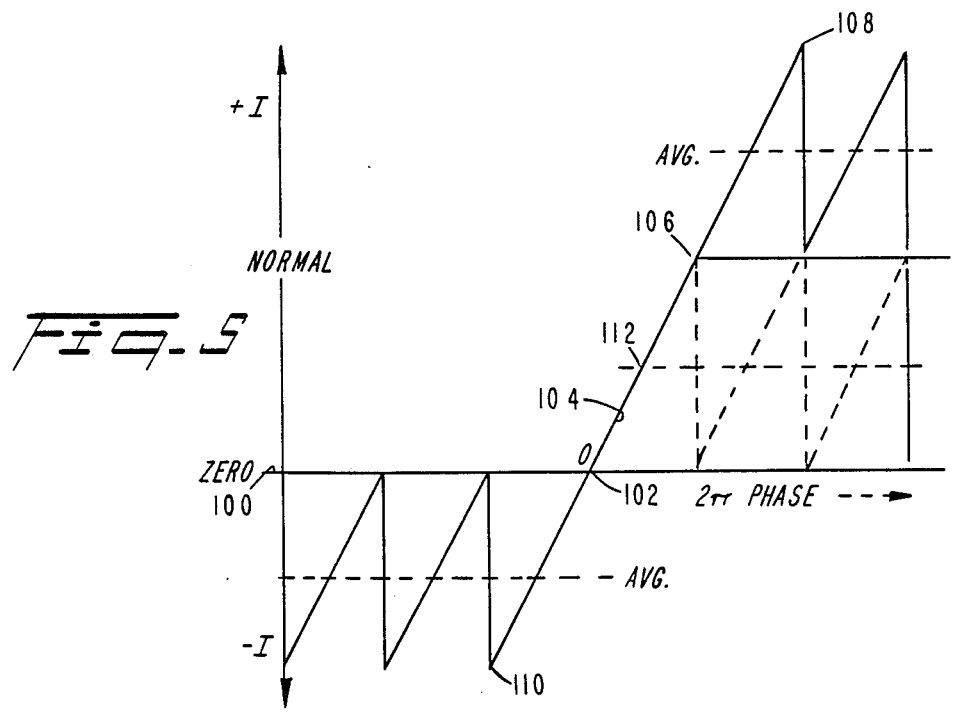

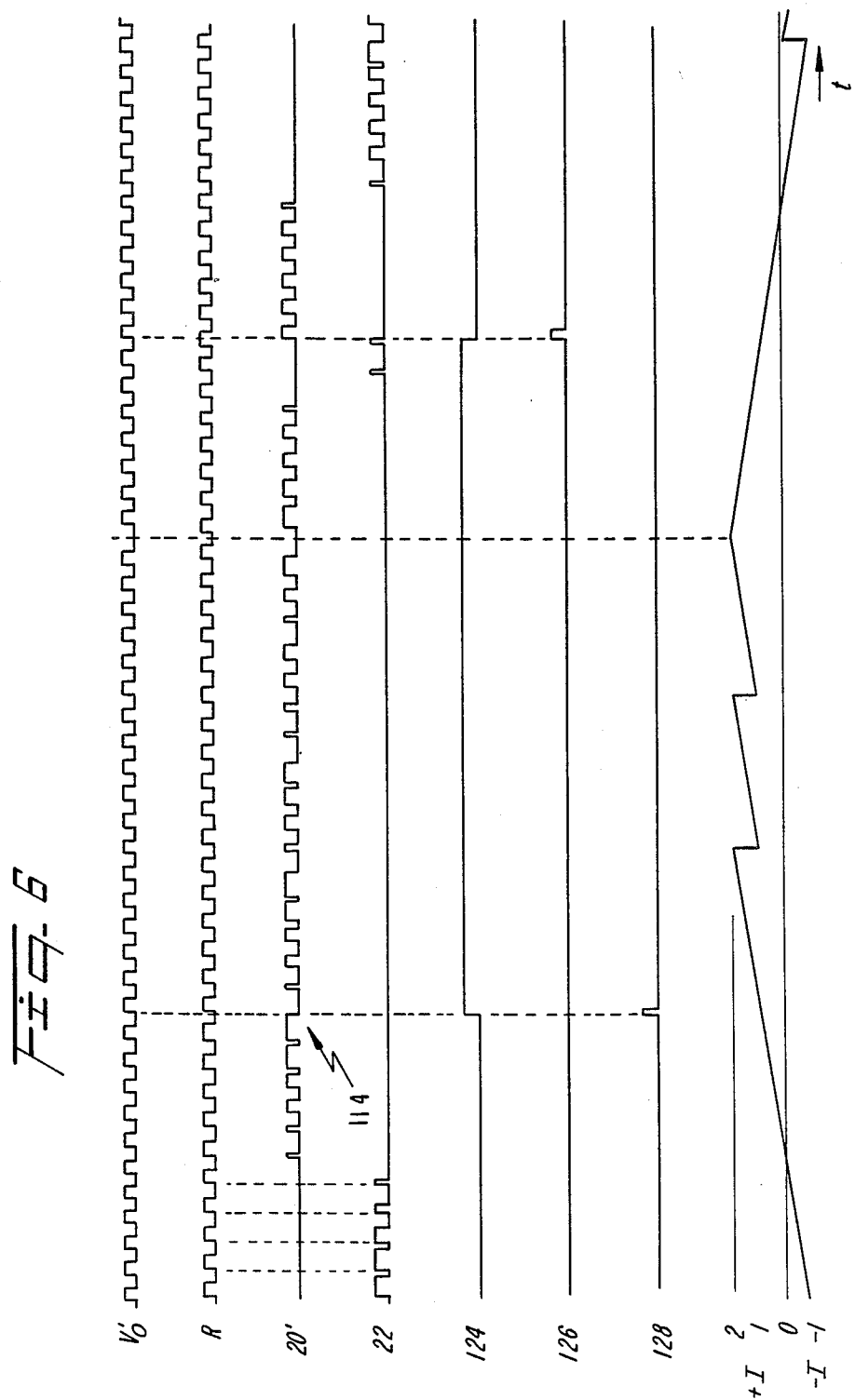

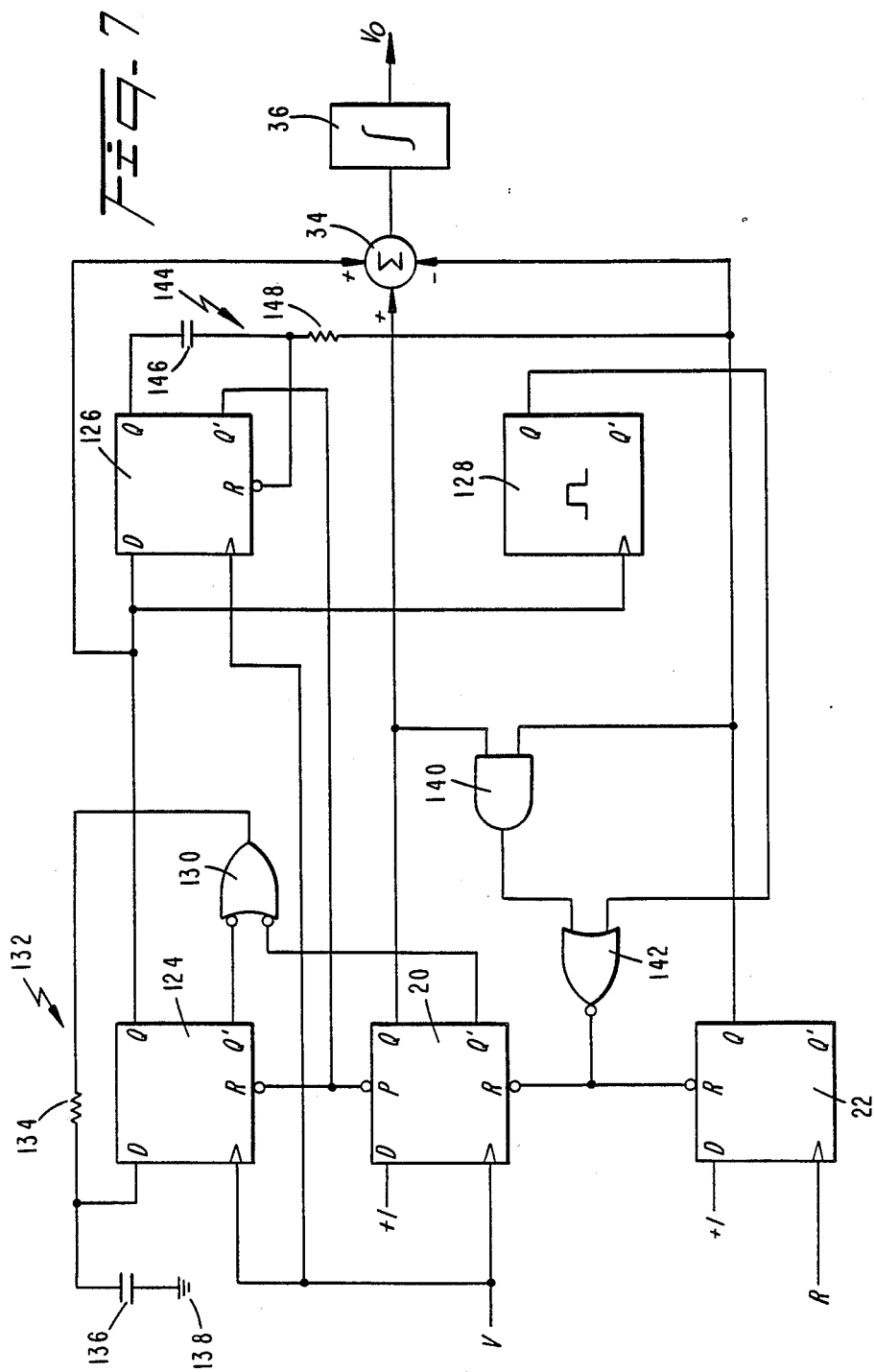

WIDE RANGE DIGITAL PHASE/FREQUENCY DETECTOR

This is a continuation of application Ser. No. 07/105,468, 8/17/87 now U.S. Pat. No. 4,893,332.

TECHNICAL FIELD

This invention relates generally to circuits for comparing the phase/frequency difference between two digital input signals, and more particularly, toward a method of and circuitry for increasing the linear phase modulation range of a digital phase/frequency detector in a phase locked loop by utilizing circuitry responsive to the maximum range of the detector to provide an output which is additive to the detector output when it is reset.

BACKGROUND ART

Circuitry for detecting the difference in phase and frequency between two digital input signals has general utility in signal analysis and is of particular importance in digital communications and frequency synthesis. In a digital phase locked loop, for example, an input signal is applied to a phase detector for comparison with a reference signal. An error signal, which is a function of the instantaneous phase/frequency difference between the input signals, is filtered and applied to control a voltage controlled oscillator (VCO). The output of the VCO, which constitutes the output of the phase locked loop, is applied as the reference signal to the phase detector to cause the phase/frequency of the VCO to "lock" to the phase/frequency of the input signal. In some applications, phase locked loops are used for signal demodulation as discussed in Gardner, Floyd M., *Phase Lock Techniques,* Second Edition, 1979, John Wiley & Sons, Chapter 9. In other applications, phase lock loops are used for signal modulation (Gardner, Chapter 9, supra) or in frequency synthesis as described in Erps et al U.S. Pat. No. 4,360,788, assigned to the assignee of this invention.

In any case, a conventional digital phase/frequency detector comprises a pair of flip flops or other bistable devices connected together and with a logic gate in a feedback circuit. The logical states of the two flip flops are determined both by the two digital input signals whose frequency/phase difference is to be detected and by the feedback gate. With the flip flops initially reset, the data terminals of both are connected to a logic "1" and the clock terminals are connected respectively to the two input digital signals. The output of each flip flop is set to a logic "1" upon detection of a positive transition of its input signal. Thus, if the input signal applied to the first flip flop has the first positive transition the first flip flop is set to a logic "1" and thereafter, the second flip flop, upon a positive transition, by its input signal, becomes set to a logic "1". Immediately after the second flip flop becomes set, however, both of the flip flops are reset by the logic gate which responds to the outputs of the two flip flops, and both remain reset until one flip flop or the other detects a positive signal transition at its input.

The outputs of the two flip flops thus are square waves having duty ratios that corresponds to the phase/frequency difference between the two input signals. If the first signal leads the second signal, only the first flip flop develops a square wave, with the duty ratio corresponding to the amount of phase/frequency lead between the two input signals. If the second input signal leads, only the second flip flop develops a square wave with a duty ratio that corresponds to the amount of phase lead of the second input signal relative to the first. The two square waves are combined in a difference circuit and the resultant is integrated to obtain a sawtooth centered about zero, that is, the sawtooth has one polarity when the first input signal leads and the opposite polarity when the second input signal leads. The sawtooth has an amplitude that corresponds to the phase/frequency difference between the two digital input signals and has a fixed period of 360°. As the phase/frequency difference between the two input signals increases monotonically, the output of the detector is a sawtooth train having a number of sawtooth cycles that corresponds to the number of full cycles of phase/frequency difference between the two digital input signals.

DISCLOSURE OF INVENTION

A primary object of the invention is, therefore, to provide a method of and circuit for increasing the detection range of a digital phase/frequency detector.

An object is to provide a method of and circuit for increasing the maximum average output of a digital phase/frequency detector by outputting the detector output to a peak value when the phase/frequency difference between the input and reference signals is a predetermined amount resetting the internal circuitry, and adding the additional phase/frequency difference to the detector output.

Still other objects and advantages of the present invention will become readily apparent to those skilled in this art from the following detailed description, wherein there is shown and described only the preferred embodiment of the invention, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 3(1)–3(5) are wave forms illustrating the operation of the conventional digital phase/frequency detector of FIG. 2;

FIG. 4 is the output characteristic of the conventional phase/frequency detector of FIG. 2;

FIG. 5 is the desired characteristic of the digital phase/frequency detector improved in accordance with the principles of the invention;

FIG. 6 contains time domain diagrams of the wave forms developed in the present invention; and FIG. 7 is a circuit diagram of the invention.

BEST MODE FOR PRACTICING THE INVENTION

The invention is designed to increase the linear phase modulation range in a digital phase locked loop of the type described in Erps et al U.S. Pat. No. 4,360,788 and Cok application Ser. No. 629,555 filed July 10, 1984, incorporated within frequency synthesizers manufactured by John Fluke Mfg. Co., Inc., Everett, Washington.

Figure 1:
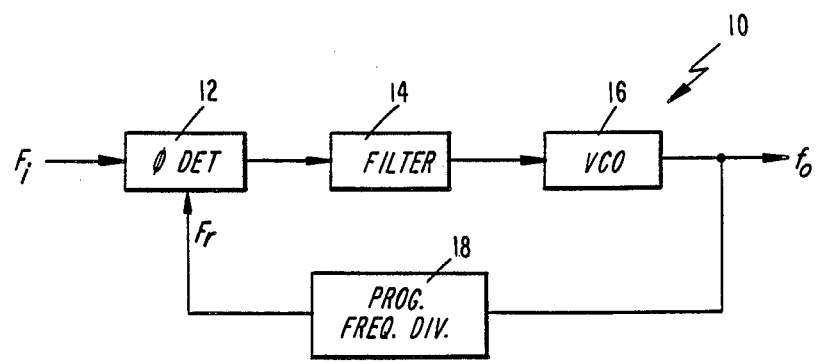
FIG. 1 is a block diagram of a conventional digital phase locked loop of the type within which the frequency/phase detector of the invention may be incorporated.

With reference to FIG. 1, the conventional phase locked loop, designated generally by 10, comprises a phase detector 12 of a type to which the present invention is directed, a filter 14 and a voltage control oscillator (VCO) 16 connected in a forward loop. Phase detector 12 has one input that receives an input signal $F_i$ and a second input that receives a reference signal $F_r$ and generates a signal corresponding to the difference in phase and frequency between the two input signals. The detector signal is filtered or smoothed by filter 14 and applied as a control input to VCO 16. The output of VCO 16 is fed back through programmable frequency divider 18 as the reference signal $F_r$ to phase detector 12. As described in detail in the Erps et al patent, supra, the signal generated by VCO 16 is controlled to have a frequency that is a multiple or submultiple, depending upon the programming of frequency divider 18, of the input signal $F_i$ and a phase having a predetermined relationship, depending upon offset biasing incorporated in detector 12, relative to the phase of the input signal.

It is to be understood that, although a particularly important application of the phase detector of the invention is in a phase locked loop such as the one shown in FIG. 1, the phase detector has numerous other significant applications in signal processing and in signal measurement.

Figure 2:
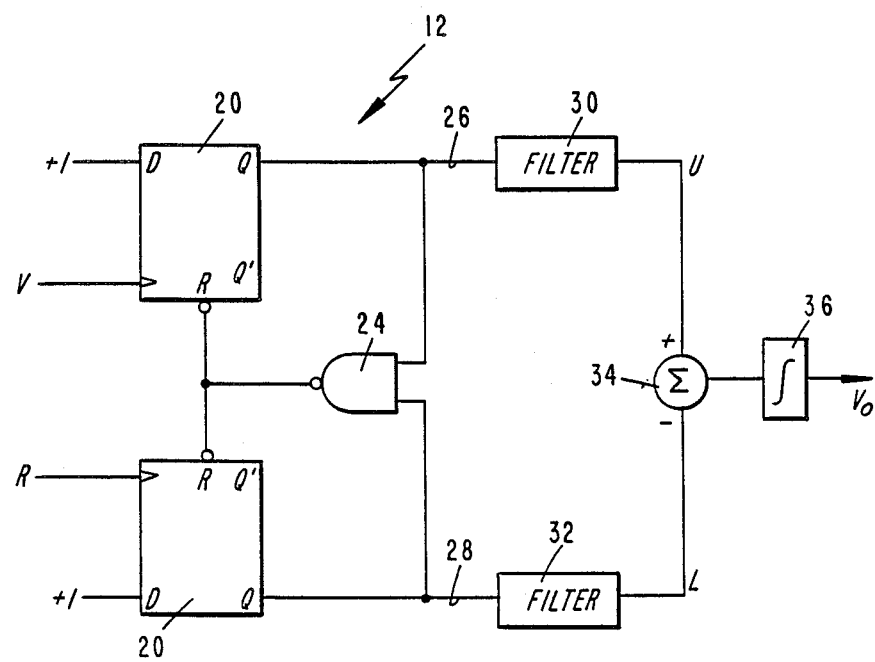
FIG. 2 is a circuit diagram of a conventional digital phase/frequency detector upon which the present invention is an improvement.

The relatively low maximum average output of the conventional phase/frequency detector upon which the invention is an improvement must be fully understood before the present invention can be appreciated. A conventional detector, shown in FIG. 2, comprises a pair of flip flops 20, 22 which for purposes of illustration are shown as D-type flip flops. In a D-type flip flop a logic level applied to the D terminal is transferred to the Q output terminal upon the occurrence of a rising clock pulse applied to the clock terminal. Each D-type flip flop 20, 22 also has a Q' output terminal which develops the logical complement of the Q output terminal, and a reset terminal R that, in response to a logic "0" or "low" signal, resets the Q output terminal to a logic "0". For purposes of illustration, the flip flops 20, 22 are assumed to operate on positive logic, i.e., a logical "1" is defined as a "high" voltage and a logical "0" is defined as a "low" voltage.

A NAND gate 24 has two inputs connected respectively to the Q output terminals of flip flops 20, 22 and an output terminal connected to the reset terminals R of the two flip flops. The D input terminal of each of the flip flops 20, 22 is connected to a logic "1" and the two clock terminals are connected respectively to a first variable (input) signal V and a second fixed (reference) signal R. The input signal V may correspond to $F_i$ and input signal R may correspond to signal $F_r$ in Figure 1, although the two signals V, R may be arbitrary. Also, although both of the signals V, R, are, in the general case, digital or square wave signals having variable and different frequencies and phases, the signal R may be a reference signal having a fixed frequency and phase.

The Q outputs of flip flops 20, 22, designated respectively as 26, 28 are applied to optional filters 30, 32 to develop output signals U, L and then to a summing circuit 34. The output of summing circuit 34 is typically averaged or smoothed in integrator 36. When the detector circuit 12 is applied in a phase locked loop, output integration is performed by the standard phase locked loop filter, such as 14 in FIG. 1.

As an overview of the detector 12, the Q output terminal of each flip flop 20, 22 is set to a logic "1" in response to the positive transition of its input clock caused by either input signal V or input signal R. If both of flip flops 20, 22 are set, however, the output of NAND gate 24 applies a logic "0" level to the reset terminals R of each flip flop, causing both Q output terminals to reset to logic "0". Thus, one or the other of flip flops 20, 22 will be set depending upon which of the input signals V or R has a positive transition that arrives first; both flip flops will become reset upon the arrival of the positive transition of the second one of the input signals V, R. The two flip flops 20, 22 thus generate square waves having duty ratios that correspond to the phase and frequency difference between the two input signals; if input signal V leads input signal R, flip flop 20 dominates and generates a square wave and flip flop 22 does not; if input signal R leads, flip flop 22 dominates and generates a square wave and flip flop 20 does not.

The operation of detector 12, and the manner by which it relates to the improvement, are explained in more detail with reference to FIG. 3 showing typical wave forms generated within the phase detector and to FIG. 4 illustrating the output wave form.

FIG. 3(1) and FIG. 3(2) represent respectively input signals V and R applied to the clock terminals of flip flops 20 and 22. These two input signals are at different frequencies and may have different duty ratios, although duty ratios are of no significance since each flip flop 20, 22 is leading edge responsive. FIGS. 3(3) and 3(4) are output signal wave forms of the signals on lines 26 and 28.

Assume that both flip flops 20, 22 are initially reset by the first positive transition 38' of input signal V whereby the Q outputs of both flip flops 20 and 22 are at logic "0" as shown at 40', 42' in FIGS. 3(3) and 3(4). The next positive transition of input signal R at 44' in FIG. 3(2) causes the output Q terminal of flip flop 22 to set to a logic "1" as shown at 46' in FIG. 3(4). On the occurrence of the next positive transition of input signal V at 48' in FIG. 3(1), the Q output terminal of flip flop 20 begins to set at a logic "1", and gate 24 responds almost immediately to reset both flip flops, driving the Q output of flip flop 22 back to a logic "0" as shown at 50' in FIG. 3(4).

It is apparent that this cycle of events repeats upon the occurrence of the positive transition of input signal R at 52' and of input signal V at 54', and is repeated again on the occurrence of the positive transitions of the R and V input signals at 56' and 58'. During this period of time, flip flop 22, being "dominant" generates a square wave having a duty ratio that decreases with a decreasing phase/frequency difference between the two input signals R and V, and that the output of the other flip flop 20 is at a logic "0".

After the occurrence of the positive transition of input signal V at 60', however, the frequency of pulses applied to the clock terminal of flip flop 20 is such that there will be two pulses, one having a positive transition at 58' and the next pulse having a positive transition at 60' before the occurrence of the next pulse by input signal R at positive transition 62'. The effect of the second successive pulse at 60' is to now set the output of flip flop 22 to a logic "1" since both flip flops 20, 22 were previously reset prior to positive pulse transition 60'. Subsequently, positive transition of input signal R at 62' will reset the Q output of flip flop 20, and the sequence continues with flip flop 20 enabled and flip flop 22 disabled as shown in FIGS. 3(3) and 3(4). The sequence will eventually recycle as the phase and frequency difference between the input signals V and R changes, with one of the flip flops always being enabled and generating a square wave having a duty ratio that corresponds to the phase/frequency difference and the other flip flop being disabled. Which of the two flip flops 20, 22 is the enabled one at any time depends upon which one of the input signals V, R leads.

As mentioned, the output lines 26, 28 of flip flops 20, 22 are passed through optional low pass filters 30, 32 to difference circuit 34 whose output is averaged or smoothed by integrator 36.

The difference signal, smoothed by 36, is a sawtooth shown in FIG. 3(5) that passes through "0" when "dominance" is transferred between flip flops 20 and 22 as shown in the region illustrated by FIGS. 3(1)–3(4) and is repetitive with a period of a full cycle (2pi) of phase/frequency as shown in FIG. 4. When two input signals V and R are within a positive or negative single cycle of being synchronized to each other or "locked", the detector characteristic is said to be in the "active region" as shown in FIG. 4. When the two input signals are outside the active region, the phase detector 12 generates a sawtooth having a maximum average signal (see dotted lines in FIG. 4) that has a magnitude of one-half the peak magnitude of the sawtooth and a polarity that depends upon which of the two signals leads.

Referring now to FIG. 5 therein is shown the desired characteristic output of the digital phase/frequency detector as contrasted to the output shown in FIG. 4 for a conventional detector. In FIG. 5, the zero axis 100 defines the zero current level. The zero horizontal point 102 defines the point at which the input signal V matches the phase of the reference signal R. Proceeding right from point 102, input signal V will lead reference signal R and conversely to the left of zero point 102 the input signal V will lag the reference signal R.

As the phase difference is increased between input signal V and reference signal R the current will increase up the slope 104 to reach the normal output level 106. There is a slight discontinuity around the 2 pi normal output point 106, as will be described herein later, and then the current increases to the peak output point 108 at the 4 pi point which is substantially twice the normal output 106 level. As the phase difference increases beyond 4 pi, there is a discontinuity which causes the current to drop from the peak output level 108 to the normal output level 106. As the phase difference continues to increase, the curent will again begin to increase towards the peak output level 108 and will repeat indefinitely every 2 pi.

The discontinuities are due to different time delays in the flip flops 20 and 22 with regard to the zero level 100 discontinuity. Discontinuity at the normal ouput level 106 is due to the difficulty in matching the current levels coming from the flip flop 124 and the flip flop 20.

Conversely, in examining the situation where the input signal V lags the reference signal R, the digital phase/frequency detector will operate in a conventional manner in that the current will increase in a negative direction until the negative output peak output level 110 is reached at which point there will be a discontinuity as the phase difference increases to cause the current level to drop back down to the zero level 100.

Since the electronic components in the detector do not operate in an ideal fashion, there are certain discontinuities and disturbances which appear at the normal output level 106 and at the zero level 100. In order to avoid operating at either of these two points, it is desired that the operating level of the detector be set away from these two points, and in the preferred embodiment it is set at the operating level 112. In the preferred embodiment, this operating level 112 is selected to be halfway between the positive peak output level 108 and the negative peak output level 110.

With the selected level in the preferred embodiment, it is possible to get the maximum range out of the phase/frequency detector in both leading and lagging phase relationships. A further advantage is that by placing the operating level as far away from the discontinuities as possible which is halfway between them, the percentage distortion becomes a small portion of a fairly large phase deviation.

Referring now to FIG. 7, therein are shown the flip flops 20, 22 which are normally a portion of a conventional digital phase/frequency detector. The input signal V is further input to the clock input a type D flip flop 124 which has its reset input connected to the preset input of the flip flop 20 (while not previously mentioned, D-type flip flops are conventionally provided with preset inputs). The input signal V is further provided to a type D flip flop 126 which has its Q' output connected to the preset and reset inputs of the flip flops 20 and 124, respectively.

The flip flop 124 has its Q output connected to the D input of the flip flop 126 and the clock input of a monostable multivibrator 128. The Q' output of the flip flop 124 is input into a negative input OR gate 130 which outputs into pulse stretcher circuitry 132 which consists of a resistor 134 connected to the D input of the flip flop 124 and a capacitor 136 connecting the resistor 134 to ground 138.

The flip flop 20 has its Q output connected by a AND gate 140 which outputs to the input of a NOR gate 142. The AND gate 140 has its other input connected to the Q output of the flip flop 22. The NOR gate 142 has its second input connected to the Q output of the monostable multivibrator 128. The output of the NOR gate 142 is input to the reset inputs of the flip flops 20 and 22. The Q output of the flip flop 20 is further connected to the summing circuit 34 and thence to the integrator 36. The summing circuit 34 further sums signals from the Q outputs of the flip flops 22 and 124.

The flip flop 126 has a Q output to a sliver reject and reset hold-off 144 which consists of a capacitor 146 which is connected to the reset input of the flip flop 126 and by a resistor 148 to the Q output of flip flop 22.

Referring now to FIGS. 6 and 7, the operation of the detector incorporating the present invention will be explained in terms of a time domain diagram. Since the operation of the detector where the input frequency V leads the reference frequency R by less than 2 pi is substantially the same as for the conventional detector, this discussion will be focused on the area where the phase difference approaches 2 pi.

As the difference approaches 2 pi, the duty ratio of the Q output of the flip flop 120 as shown by the pulse 114 approaches 100% (full width) and conversely the Q' output approaches 0% (zero width). This causes the output of the negative input OR gate 130 via the pulse stretcher circuitry 132 to hold the D input of the flip flop 124 at "1" until the next leading edge of the input signal V causes the flip flop 124 to change state. When the flip flop 124 changes state, the Q output will go to "1". Simultaneously, the Q' output of flip flop 124 will go to "0" which will cause the negative OR gate 130 to remain at "1" and hold the "1" at the D input of flip flop 124.

Thus, at the 2 pi point the Q output of the flip flop 124 is being provided to the summing circuit 34 where it is summed with the Q output of the flip flop 20.

Simultaneously, the Q output of the flip flop 124 is provided to the clock input of the monostable multivibrator 128. The transition of the flip flop 124 causes the change of state of the monostable multivibrator 128 so as to cause an output pulse which by means of the NOR gate 142 resets the flip flops 20 and 22.

When the flip flop 20 is reset, the Q output goes to "0" and thus its contribution to the summing circuit 34 is zero. As the phase differences increases beyond 2 pi, the pulse width of the Q output of the flip flop 20 will increase and will be additive with the normal output out of the Q output of the flip flop 124.

As the phase difference increases from 2 pi to 4 pi and beyond the output from the flip flop 124 will remain "1" and the effect of the flip flop 20 will effectively superimpose the effect of a conventional detector over that of the present invention.

Heretofore, the relationship has been described for the situation where the input signal V is constantly increasing with respect to the reference signal R. From this point, when the phase relationship is decreased so as to cause the input signal V to more closely approach the reference signal R, the operation is slightly different. As the phase difference goes from greater than 2 pi to less than 2 pi (FIG. 5), the duty ratio of the pulses out of the Q output of the flip flop 20 decrease to zero percent duty ratio and the pulses out of the Q output of the flip flop 22 increase in duty ratio. When a predetermined width of pulse (duty ratio) is reached as established by the capacitor 146, they allow the reset signal to the flip flop 126 to be removed sufficiently for the input signal V into the clock input of the flip flop 126 to cause the Q output of the flip flop 126 to go to "1".

With the Q output of the flip flop 126 at "1", the Q' output goes to "0" causing reset of the flip flop 124 and preset of the flip flop 20. Resetting the flip flop 124 causes its Q output to go to "0" and the Q output of the flip flop 20 to go to "1". Meanwhile, after the RC time constant of the sliver reject and reset hold-off 144, the flip flop 126 will again change state so as to cause the Q output to go to "0". Thereafter, the phase/frequency detector 12 will operate in the same manner as the conventional detector.

In this disclosure, there is shown and described only the preferred embodiment of the invention, but as before mentioned, it is to be understood that the invention is capable of use in various other combinations and environments and is capable of changes or modifications within the scope of the inventive concept as expressed herein. For example, it would be possible to cascade additional flip flops so as to provide increased range by duplicating the characteristic above the zero level 100 equally in the negative direction. Further, as would be apparent to those skilled in the art, additional stages could be added where desired to further increase the range by using a similar approach as to that disclosed herein.

We claim:

1. A digital phase/frequency detector for detecting differences in phase or frequency between a variable input signal and a reference input signal comprising:
    variable signal and reference signal terminals for receiving the variable and reference input signals;
    phase/frequency detector means receiving said variable and reference input signals from said variable and reference signal terminals, the phase/frequency detector means having a preset input and being responsive to a phase or frequency difference between said variable and reference input signals for generating a square wave signal having a duty ratio corresponding to the phase or frequency difference between said variable and reference input signal between a minimum and a maximum phase difference, the duty ratio being repetitively adjusted with each cycle of the variable input signal;
    fixed level generator means having a reset input and responsive to said variable input signal and to said square wave signal for generating a fixed level offset signal in response to said variable and reference input signals having a frequency or phase difference greater than or equal to said maximum phase difference;
    reset generator means responsive to said variable input signal, said square wave signal, and to said fixed level generator means and for applying a preset signal to said phase/frequency detector means and a reset signal to said fixed level generator means in response to a phase transition of said variable and reference input signals from a phase value equal to or greater than said maximum phase difference to a phase value less than said maximum phase difference to a phase value less than said maximum phase difference; and
    summing means for adding said square wave signal from said phase/frequency detector and said fixed level offset signal from said fixed level generator means and outputting the resultant summed signal.

2. A detector circuit as claimed in claim 1 comprising integrating means coupled to said summing means for generating a sawtooth signal from said resultant summed signal.

3. A detector circuit as claimed in claim 1 wherein said phase/frequency detector means, said fixed level generator means and said reset generator means each comprise flip-flop means, said detector circuit further comprising integrator means for integrating said summed signal to generate an integrated output signal containing discontinuities as a result of timing characteristics of said flip-flop means, the circuit further comprising delay means coupled to said flip-flop means for smoothing said discontinuities.

4. A method of increasing the phase/frequency range of a digital phase/frequency detector which detects differences in phase or frequency between a variable input signal and a reference input signal, the method comprising generating at detector means for each cycle of the variable input signal a square wave signal having a duty ratio corresponding to the phase or frequency difference between said input signals between a minimum and a maximum phase difference, generating at fixed level generator means a fixed level offset signal in response to said input signals having a frequency or phase transition of said input signals from a phase value equal to or greater than said maximum phase difference to a phase value less than said maximum phase difference and summing said square wave signals and said fixed level offset signal.

* * * * *